United States Patent [19]

Lu

[11] Patent Number: 5,329,193
[45] Date of Patent: Jul. 12, 1994

[54] COMPUTER CONTROLLER

[76] Inventor: Chao-Cheng Lu, No. 4-4, Alley 27, Lane 143 Chun Kung Road, Taipei, Taiwan, 11614

[21] Appl. No.: 974,533
[22] Filed: Nov. 12, 1992
[51] Int. Cl.⁵ .................... H03K 17/28; H03K 5/24
[52] U.S. Cl. .................... 307/592; 307/359; 307/630
[58] Field of Search ............ 307/359, 553, 562, 592, 307/603; 323/312–315

[56] References Cited

U.S. PATENT DOCUMENTS

| | | | |
|---|---|---|---|
| 4,145,743 | 3/1979 | DiCiurcio | 307/359 |
| 4,377,781 | 3/1983 | Tatsushi et al. | 323/313 |
| 4,433,390 | 2/1984 | Carp et al. | 307/592 |
| 4,498,040 | 2/1985 | Tatsushi et al. | 323/313 |
| 4,549,098 | 10/1985 | Fushiki | 307/359 |
| 4,551,105 | 3/1987 | Inbar | 307/359 |
| 4,573,005 | 2/1986 | Plassche | 323/315 |
| 4,583,009 | 4/1986 | Eng, Jr. | 323/313 |
| 4,965,469 | 10/1990 | Kondoh et al. | 323/315 |
| 5,122,695 | 6/1992 | Lu | 307/642 |
| 5,185,538 | 2/1993 | Kondoh et al. | 307/359 |
| 5,206,540 | 4/1993 | de Sa e Silva et al. | 307/592 |

Primary Examiner—Timothy P. Callahan
Assistant Examiner—Tuan T. Lam
Attorney, Agent, or Firm—Jacobson, Price, Holman & Stern

[57] ABSTRACT

A new computer controller is disclosed for controlling the output voltage of a SCR controller to a load. The computer controller includes a computer unit comprising a first pulse generator, a central processing unit, a first voltage comparator and a digital analog converter, and a control unit controlled by the computer unit and connected to the load through the SCR controller and consisting of a second pulse generator, an integrator circuit, a second voltage comparator, a turn-on circuit and a turn-off circuit.

3 Claims, 3 Drawing Sheets

COMPUTER CONTROLLER

BACKGROUND OF THE INVENTION

The present invention relates to a micro computer control circuit for use with the new SCR controller disclosed in U.S. Pat. No. 5,122,695 in controlling the voltage applied to the load.

U.S. Pat. No. 5,122,695 disclosed a new SCR controller (silicon controlled rectifier controller) specifically designed for controlling the voltage of DC power supply. Controlling this new SCR controller through manual operation may limit its application. Therefore, a specially designed micro computer is necessary to automatically control the operation of this new SCR controller so as to extend its application for controlling DC power supply operated electrolytic and electroplating equipment, electric cars and electric motorcycles, and any of a variety of other DC power supply operated equipment.

SUMMARY OF THE INVENTION

The main object of the present invention is to provide a new computer controller for controlling the the distance between the turn-on pulse and the turn-off pulse of the new SCR controller of U.S. Pat. No. 5,122,695 so as to further control the voltage to the load. Accordingly, the subject matter of U.S. Pat. No. 5,122,695 is incorporated herein by reference. The new computer controller according to the preferred embodiment of the present invention comprises a computer unit and a control unit. The computer unit comprises a central processing unit (CPU) which consists of a regular CPU chip of either 8 or 16 bits, a first pulse generator comprising a timer IC and controlled to provide the center processor unit with an output frequency ranging from several Hz to several KHz according to different requirements, a digital-analog converter (DAC) consisting of a DAC IC matching the CPU and controlled to convert the digital output of the CPU to a corresponding analog signal in direction proportion, and a first voltage comparator consisting of a voltage comparator IC and controlled to compare the feedback value with the reference value and then sends a signal to the CPU in causing it to increase or drop the voltage according to the comparison result until the comparison between the feed back value and the reference value becomes +/− 1 digit. The control unit comprises a second pulse generator consisting of a timer IC and a phase inverter and controlled to produce a narrow pulse, an integrator circuit consisting of an integrated circuit, which comprises a constant current circuit and a capacitor, and a discharging circuit and is controlled to turn the square wave pulse signal from the second pulse generator into a triangular wave pulse signal, a second voltage comparator consisting of a charge-coupled device, a transistor and an emitter resistor and controlled to produce a square wave output transmitted to the turn-on circuit and the turn-off circuit of a SCR controller, a turn-off circuit being a falling edge triggered circuit controlled to provide a turn-off pulse voltage to the turn-off circuit of the SCR controller, a turn-on circuit comprising a diode and a shunt resistor and connected to provide a turn-on pulse voltage to the turn-on circuit of the SCR controller.

BRIEF DESCRIPTION OF THE PREFERRED EMBODIMENT

DETAILED DESCRIPTION OF THE PREFERRED EMBODIMENT

Figure 1:
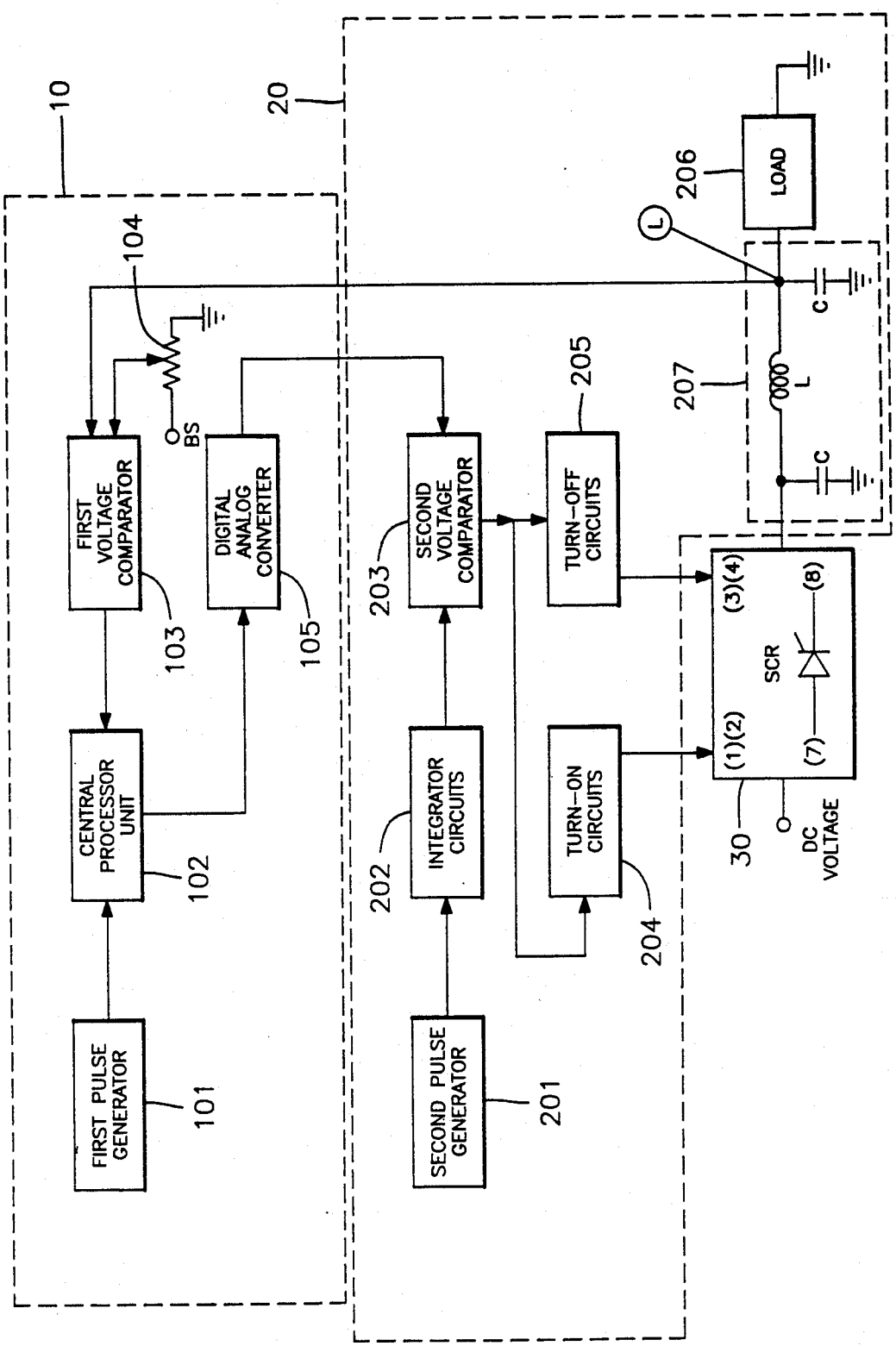
FIG. 1 is a block diagram of the new computer controller according to the present invention.
Figure 2A:
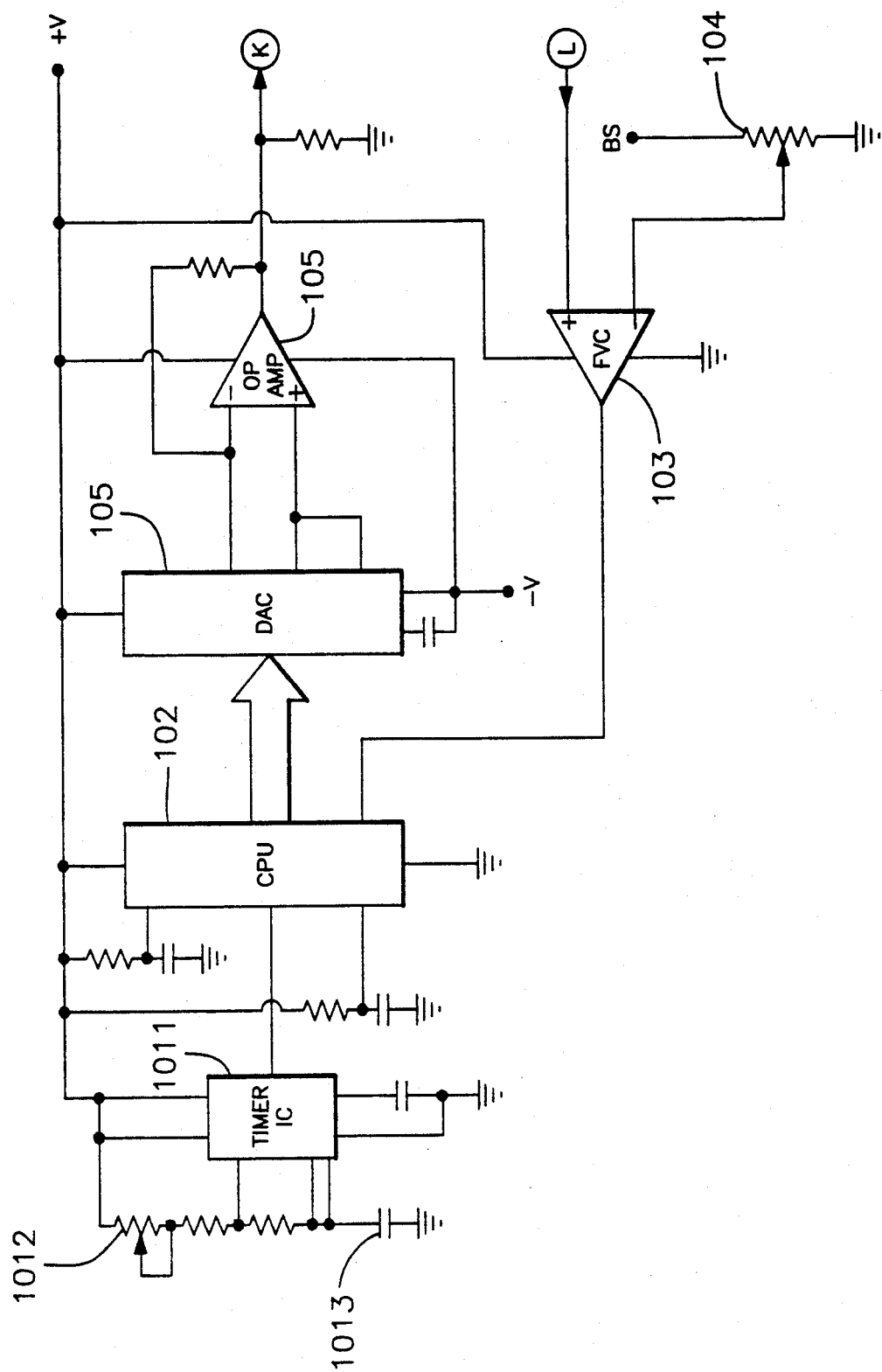
FIG. 2A is a circuit diagram of the computer unit thereof.
Figure 2B:
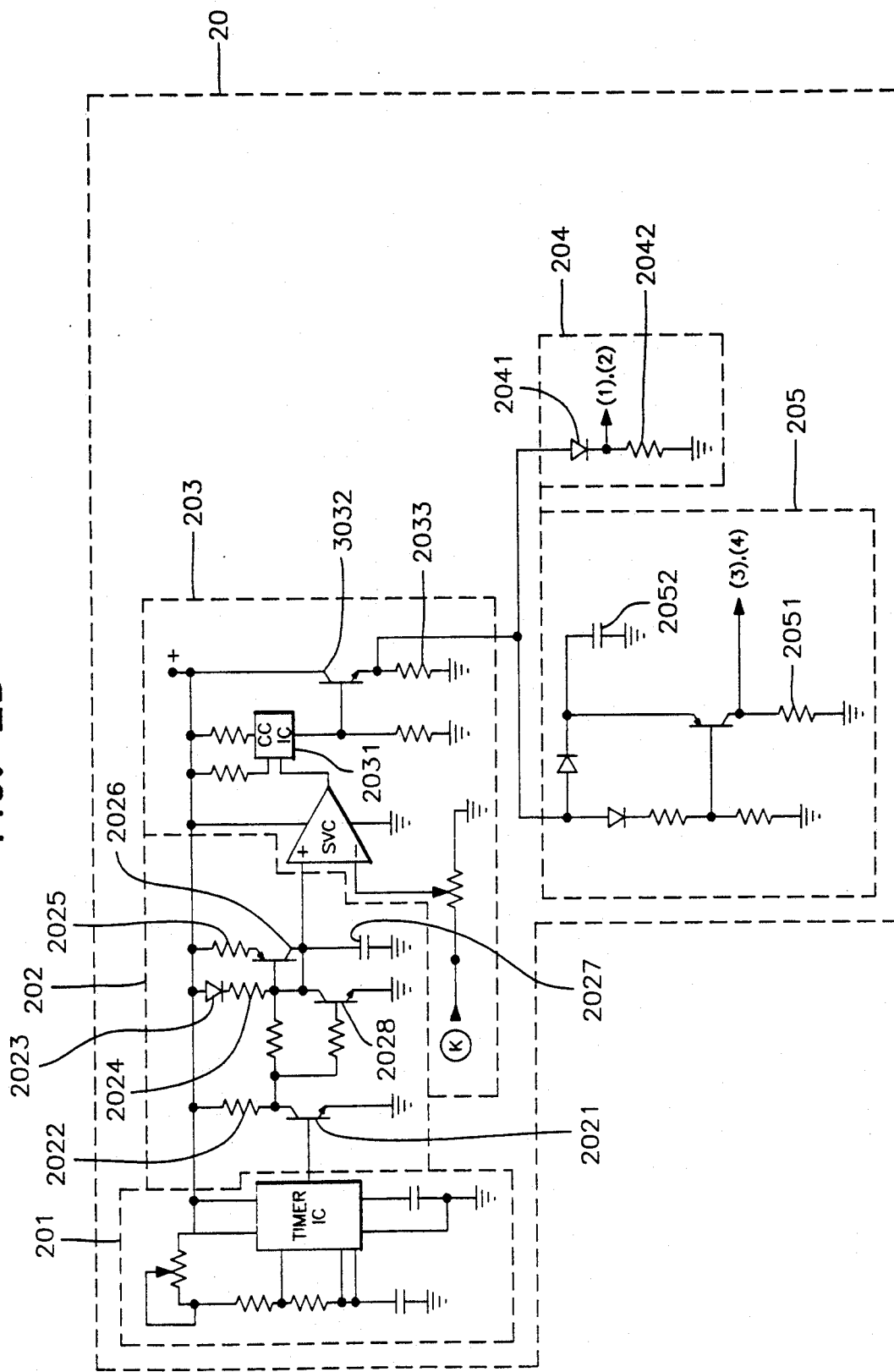
FIG. 2B is a circuit diagram of the control unit thereof.

Referring to FIGS. 1, 2A and 2B, a new computer controller according to the present invention is generally comprised of a computer unit 10 and a control unit 20. As illustrated in FIG. 2A, first pulse generator 101 comprises a timer IC 1011, a variable resistor 1012 and a capacitor 1013 and is controlled to provide a square wave pulse signal to a central processing unit (CPU) 102 for counting. The oscillation frequency of the output of the first pulse generator 101 is determined according to the time constant of the variable resistor 1012 and the capacitor 1013, namely, the frequency of the output of the first pulse generator 101 can be changed by altering the impedance of the variable resistor 1012. The frequency of the square wave pulse signal of the first pulse generator 101 is determined according to the load 206 to be controlled. The CPU 102 can be a single chip micro controller or any suitable processing unit the number of bits of which is determined according to the load 206 to be controlled. Except the time clock from the first pulse generator 101, the input terminal of the CPU 102 also receives the output of a first voltage comparator 103. The first voltage comparator 103 provides "High" and "Low" potentials to the CPU 102 for permitting the output of the CPU 102 to be varied with the demand of the load 206. The output terminal of the CPU 102 is connected to the input terminal of a digital analog converter (DAC) 105. When the voltage at the input terminal of the CPU 102 becomes high, the CPU 102 is driven to execute the instruction of counting up, and the voltage at the output terminal of the CPU 102 becomes high, thereby causing the voltage at the output terminal of the DAC converter 105 to be turned from low potential to high potential. On the contrary, if the voltage at the output terminal of the first voltage comparator 103 is at low potential, the CPU 102 is driven to execute the instruction of counting down, causing the voltage at the output terminal of the DAC converter 105 to be turned from high potential to low potential. The output terminal of the DAC converter 105 is connected to an input terminal of a second voltage comparator 203 which forms part of the control unit 20. The control unit 20 comprises a second pulse generator 201, which is similar to the first pulse generator 101 of the computer unit 10 in structure but produces a pulse signal of different frequency. The output frequency of the second pulse generator 201 is to control the pulse frequency of a turn-on circuit 204 and a turn-off circuit 205. The output terminal of the second pulse generator 201 is connected to the input terminal of an integrator circuit 202. The input terminal of the integrator circuit 202 is controlled by the base of a transistor 2021 of a phase converter circuit, which has a load resistor 2022 with an output waveform that is the reverse of the input waveform of the base of the transistor 2021. The output terminal of the load resistor 2022 is connected to the base of a charging circuit and a discharging circuit. The charging circuit consists of a diode 2023, a resistor 2024, a transistor 2026, a time constant resistor 2025 connected to the emitter of the transistor 2026, and a time constant capacitor 2027 connected to the collector of the transistor 2026. The two opposite ends of the capacitor 2027 are charged by constant current, and therefore the voltage at both ends of the capacitor 2027 increases linearly, and the related time constant value is determined according to the RC value of the resistor 2025 and the capacitor 2027. The discharge circuit comprises a transistor 2028 having its base connected to the output terminal of the load resistor 2022, its collector connected to the collector of the transistor 2026, and its emitter connected to the opposite end of the capacitor 2027. The discharge circuit operates as the output of the second pulse generator 201 is low or zero. Because of the constant current charging circuit and the instant discharge circuit, a triangular wave will occur at the two opposite ends of the capacitor 2027. The frequency of this triangular wave is determined according to the output frequency of the second pulse generator 201, and the frequency of the second pulse generator is determined according to the nature of the load 206. The output terminal of the capacitor 2027 is connected to the non-inverter terminal of a second voltage comparator 203. The inverter terminal of the second voltage comparator 203 is connected to the output terminal of the DAC converter 105 of the computer unit 10. When the potential at the output terminal of the second voltage comparator 203 is higher than at its inverter terminal, the charge-coupled device 2031 at the output terminal of the second voltage comparator 203 becomes OFF. On the contrary, when the potential at the inverter terminal of the second voltage comparator 203 is higher than its non-inverter terminal, the charge-coupled device 2031 becomes ON. Because the input to the non-inverter terminal of the second voltage comparator 203 is a triangular wave and the input to the inverter terminal is a DC potential, the output from the second voltage comparator 203 is a square wave, and the pulse width of the square wave is determined according to the condition of the DC potential, namely, the pulse width becomes wider when the DC potential is high or narrower when low. The cycling of the pulse width of the square wave is determined according to the requirement of the load 206. The output terminal of the charge-coupled device 2031 is connected to the base of a transistor 3032. The emitter of the transistor 3032 is connected to an emitter resistor 2033 for output. The collector of the transistor 3032 is connected to a power source. The output terminal of the emitter resistor 2033 is connected to the turn-on circuit 204 and the turn-off circuit 205. The turn-on circuit 204 comprises a diode 2041 and a load resistor 2042. The load resistor 2042 provides an output of square wave to trigger a silicon controlled rectifier (SCR). The turn-off circuit 205 is a falling-edge triggered circuit consisting of a collector resistor 2051 and a capacitor 2052. During the square wave output of the emitter resistor 2033, the output of the collector resistor 2051 of the turn-off circuit 205 is zero. At the falling time when the square wave output of the emitter resistor 2033 was turned from a positive output to the zero output, an instant square wave output is immediately transmitted to the input terminal of the turn-off circuit of a SCR controller 30 (as disclosed in U.S. Pat. No. 5,122,695), thereby causing the SCR controller 30 to be turned off. The cycling of this instant square wave output is determined according to the RC value of the capacitor 2052 and the collector resistor 2051, and the RC value is determined according to the nature of the load 206. As illustrated in FIG. 1, the contacts (1) and (2) of the SCR controller 30 are connected to the turn-on circuit 204 of the control unit 20, the contacts (3) and (4) of the SCR controller 30 are connected to the turn-off circuit 205 of the control unit 20, the contact (7) of the SCR controller 30 is connected to positive power supply, the contact (8) of the SCR controller 30 is connected to the load 206 through a $\pi$ type filter 207. The $\pi$ type filter 207 turns the output of the output contact (8) of the SCR controller 30 into DC power supply for driving the load 206.

Referring to FIG. 1 again, a standard voltage controller 104 is connected to the first voltage comparator 103. The standard voltage controller 104 is comprises a standard voltage BS and a variable resistor and is controlled to provide a standard voltage to the load 206. When the first voltage comparator 103 provides a positive output as a voltage was set by the standard voltage controller 104, the CPU 102 is driven to count up. The counting speed of the CPU 102 is directly proportional to the frequency of the output pulse of the first pulse generator 101. When the CPU 102 counts up, the voltage at the output terminal of the DAC converter 105 is relatively increased. This gradual increasing of voltage is transmitted to the inverter terminal of the second voltage comparator 203 while its non-inverter terminal receives a triangular wave. The time constant of this triangular wave is determined according to the RC value of the resistor 2025 and the capacitor 2027, and its frequency is controlled by the second pulse generator 201. Because the input terminal of the second voltage comparator 203 simultaneously receives a triangular wave pulse and a linear DC voltage, the second voltage comparator 203 produces an output of square wave pulse. The higher the DC input voltage, the wider the square wave output pulse and the longer the SCR controller 30 being electrically connected and the higher the output voltage of the SCR controller 30. The wide square wave output voltage from the SCR controller 30 is then filtrated through the $\pi$ type filter 207 and turned into a DC voltage to the load 206. When turned on, the load 206 gives a feedback DC voltage to the non-inverter terminal of the first voltage comparator 103. If the feedback DC voltage which has is higher than the standard voltage been set, the output terminal of the first voltage comparator 103 becomes at a negative or zero potential, thereby causing the CPU 102 to count down. As the CPU 102 counts down, the output voltage of the DAC converter 105 drops, and the square wave of the output of the second voltage comparator 203 becomes narrower, and therefore the DC voltage to the load 206 drops. As the DC voltage to the load 206 drops, the load 206 gives a corresponding feedback signal to the first voltage comparator 103. This procedure is repeated again and again until the feedback voltage becomes equal or approximately equal to the standard voltage which has been set. The alternation of the positive or negative state of the output of the first voltage comparator 102 is made by plus or minus one digital ($\pm 1$ digital). Therefore, the DC voltage varies with the standard voltage which has been set, and the desired DC output voltage can be obtained by regulating the standard voltage.

What is claimed is:

1. A computer controller comprising a computer unit, a control unit, a SCR controller, a $\pi$ type filter and a load, said π type filter having a first node connected to said SCR controller and a second node connected to the load, said SCR controller being connected to the control unit, wherein said computer unit comprises a first pulse generator, a central processing unit connected to an output from said first pulse generator, a first voltage comparator comparing an output from said π type filter with a standard voltage at input terminals and having an output connected to said central processing unit, a digital analog converter connected to an output from said central processing unit; and wherein said control unit comprises a second pulse generator, an integrator circuit connected to an output from said second pulse generator, a second voltage comparator connected to an output from said integrator circuit and also connected to an output from said digital analog converter, a turn-on circuit connected to an output from said second voltage comparator and a turn-off circuit also connected to said output from the second voltage comparator; said π type filter being an inductance-capacitance controlled to convert a square wave voltage to a DC voltage; said load having load characteristics such as resistance, inductance, capacitance and battery.

2. The computer controller of claim 1 wherein said first pulse generator comprises a timer IC, a time constant resistor connected to said timer IC and a capacitor also connected to said timer IC, said first pulse generator being controlled to provide a pulse output to said central processing unit, the frequency of the pulse output being determined according to the RC time constant value of the resistor and the capacitor; and wherein said central processing unit is comprised of a microcontroller IC controlled to count up or down according to the state of potential received from said input terminals of the first voltage comparator, the counting speed being controlled by the frequency of the output pulse of said first voltage comparator; said digital analog converter being controlled by said central processing unit to provide an output voltage to said second voltage comparator of said control unit, the output voltage of said digital analog converter being determined according to the nature of said load, the maximum and minimum limits of the output voltage of said digital analog converter being determined by said first voltage comparator; the input terminal of said first voltage comparator being directly coupled to a standard voltage controller and said load to receive a standard voltage from said standard voltage controller and a feedback voltage from said load, the output terminal of said first voltage comparator being directly coupled to a control terminal of said central processing unit.

3. The computer controller of claim 1 wherein said second pulse generator comprises a timer IC, a time constant resistor connected to said timer IC and a capacitor also connected to said timer IC, said second pulse generator being controlled to provide a pulse output to said integrator circuit directly; said integrator circuit comprising a constant current integrated IC and a discharge circuit connected to said constant current integrated IC, said integrator circuit being controlled to provide a triangular pulse to said second voltage comparator, the frequency of the triangular pulse from said integrator circuit being controlled by the second pulse generator, the output terminal of the second voltage comparator being directly coupled to the turn-on circuit and the turn-off circuit of said control unit; the turn-on circuit of said control unit comprising a diode directly coupled to the output terminal of said second voltage comparator and a shunt resistor directly coupled to a turn-on circuit of said SCR controller; the turn-off circuit of said control unit being a falling edge triggered circuit and controlled to give a turn-off pulse to a turn-off circuit of said SCR controller in turning it off as the output from said second voltage comparator was turned from a high potential to a low potential.

* * * * *

UNITED STATES PATENT AND TRADEMARK OFFICE
CERTIFICATE OF CORRECTION

PATENT NO. : 5,329,193
DATED : July 12, 1994
INVENTOR(S) : Chao-Cheng Lu

It is certified that error appears in the above-identified patent and that said Letters Patent is hereby corrected as shown below:

In the drawings, Sheet 3, Figure 2B, the line extending directly from resistor 2024 to the collector of transistor 2028 should be deleted.

Signed and Sealed this

Fifteenth Day of November, 1994

BRUCE LEHMAN

Attest:

Attesting Officer

Commissioner of Patents and Trademarks